(12) United States Patent
Xie

(10) Patent No.: US 9,543,366 B2
(45) Date of Patent: Jan. 10, 2017

(54) DISPLAY PANEL AND DISPLAY APPARATUS HAVING THE SAME

(71) Applicant: BOE TECHNOLOGY GROUP CO., LTD., Beijing (CN)

(72) Inventor: Hongjun Xie, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/241,620

(22) PCT Filed: Sep. 27, 2013

(86) PCT No.: PCT/CN2013/084442
§ 371 (c)(1),
(2) Date: Feb. 27, 2014

(87) PCT Pub. No.: WO2014/183366
PCT Pub. Date: Nov. 20, 2014

(65) Prior Publication Data
US 2014/0339520 A1 Nov. 20, 2014

(30) Foreign Application Priority Data

May 15, 2013 (CN) .......................... 2013 1 0179052

(51) Int. Cl.
*H01L 27/32* (2006.01)

(52) U.S. Cl.
CPC ................................ *H01L 27/3244* (2013.01)

(58) Field of Classification Search
CPC .......... H01L 33/02; H01L 33/20; H01L 33/26; H01L 33/38
USPC ..................... 257/82, 88, E25.019, E25.028, E31.099, 257/E33.001, 40; 340/815.45; 345/39, 46, 173; 348/801; 362/612, 555; 438/197, FOR. 157, 438/FOR. 287
See application file for complete search history.

(56) References Cited

U.S. PATENT DOCUMENTS

| 6,479,764 B1* | 11/2002 | Frana ................... H05K 1/0222 174/262 |
| 2002/0163509 A1* | 11/2002 | Roberts ......................... 345/173 |
| 2005/0062039 A1* | 3/2005 | Kim ............................... 257/40 |
| 2005/0130360 A1* | 6/2005 | Zhan et al. .................... 438/197 |
| 2009/0002328 A1* | 1/2009 | Ullrich et al. ................. 345/173 |

(Continued)

FOREIGN PATENT DOCUMENTS

| CN | 101021624 A | 8/2007 |
| CN | 101630101 A | 1/2010 |

(Continued)

OTHER PUBLICATIONS

Dictionary definition, 3 pages.*

(Continued)

*Primary Examiner* — Kimberly Rizkallah
*Assistant Examiner* — Bo Bin Jang
(74) *Attorney, Agent, or Firm* — Ladas & Parry LLP

(57) ABSTRACT

The embodiments of the present invention provide a display panel and a display apparatus having the display panel. The display panel includes: an array substrate, a printed circuit board, a chip on film. One end of the chip on film is attached to a connection region of the array substrate, and the other end of the chip on film is attached to the printed circuit board, and the surface of the chip on film disposed with a chip faces the array substrate, and the connection region is disposed at a side of the array substrate away from a light-emitting surface.

5 Claims, 2 Drawing Sheets

(56) References Cited

U.S. PATENT DOCUMENTS

| | | |
|---|---|---|
| 2010/0013756 A1 | 1/2010 | Park |
| 2011/0096013 A1* | 4/2011 | Krumpelman et al. ...... 345/173 |
| 2013/0016049 A1* | 1/2013 | Eom et al. .................... 345/173 |
| 2013/0170115 A1* | 7/2013 | Jung et al. ............... 361/679.01 |

FOREIGN PATENT DOCUMENTS

| | | |
|---|---|---|
| CN | 102881710 A | 1/2013 |
| CN | 103325317 A | 9/2013 |
| CN | 203311768 A | 11/2013 |
| CN | 203311768 U | 11/2013 |
| KR | 20030037157 A | 5/2003 |

OTHER PUBLICATIONS

International Search Report mailed Feb. 20, 2014; PCT/CN2013/084442.

First Chinese Office Action dated Sep. 30, 2014; Appln. No. 201310179052.5.

International Preliminary Report on Patentability Appln. No. PCT/CN2013/084442; Dated Nov. 17, 2015.

* cited by examiner

DISPLAY PANEL AND DISPLAY APPARATUS HAVING THE SAME

FIELD OF THE INVENTION

Embodiments of the present invention relate to a field of display technology, in particular, to a display panel and a display apparatus having the display panel.

BACKGROUND

Flat panel displays are currently the most popular display. Among the flat panel displays, active matrix organic light emitting diode (AMOLED) display apparatus has been widely used in electronic products such as computer screen, mobile phone and so on, due to its characteristics such as light and thin outline, saving electricity, no irradiation and so on.

AMOLED display panel mainly comprises an array substrate, a chip on film (COF), and a printed circuit board (PCB). The array substrate comprises a display region used to perform displaying and a connection region (that is, Fan Out) located at the periphery of the display region. End heads of leads in the display region are located in the connection region. Leads and a chip are disposed on one side of the COF, and the leads of the connection region of the array substrate are connected to the PCB by these leads and chip.

As illustrated in FIG. 1, preparing a conventional AMOLED display panel comprises: firstly attaching a surface of the COF 200 disposed with a chip 201 on the connection region 400 of the array substrate 100, wherein the connection region 400 is formed at the segment difference between the array substrate 100 and an package layer 101; then attaching the other end of the surface of the COF 200 on the PCB 300; subsequently folding the COF 200 by 180°, so that the PCB 300 is disposed on the back side of the array substrate 100 (i.e. the side which does not emit light), at this time, the chip 201 on the COF 200 is disposed towards a side away from the array substrate 100. When assembling the display panel, it is required to not only guarantee the occupation space of the COF 200, but also guarantee the safety of the chip 201 on the COF 200, since the chip 201 should not be pressured and should not contact metal. Since the existence of the folding region of the COF 200, the frame of the display apparatus has to leave enough space, to place not only the COF 200 but also a glue frame and an iron frame, so that it causes the frame of the display apparatus to be too wide; meanwhile, a distance between the PCB 300 and the array substrate 100 should be at least equal to the diameter of the folding region of the COF 200, so the PCB 300 may not be disposed close to the array substrate 100, so that it causes a problem that the thickness of the display apparatus is too large.

In addition, since the COF 200 is attached on the surface of the PCB 300 facing the array substrate 100, wires of the surface are transverse wires, and wires of the surface of the PCB 300 away from the array substrate 100 are vertical wires (here, the wires perpendicular to the paper plane is called as vertical wire, and the wires perpendicular to the vertical wire and parallel to the circuit board is called as transverse wire). The vertical wires are mainly used to transfer signals between respective electronic components 301 of the PCB 300, and the transverse wires are mainly used to connect the electronic components 301 to the bonding pins. In order to avoid the electronic components 301 on the PCB from being damaged, the electronic components 301 are generally disposed on a surface away from the array substrate 100; however, in this way, it would compete in space with the vertical wires, causing difficulty in wiring.

SUMMARY

Embodiments of the present invention provide a display panel with a reduced frame width and a display apparatus having the display panel, which may solve at least one of the above existing technical problems.

According to one aspect of the present invention, there is provided a display panel, comprising: an array substrate, a printed circuit board (PCB), a chip on film (COF), wherein a chip is disposed on a first surface of the COF, and one end of the first surface is attached to a connection region of the array substrate, and the other end of the first surface is attached to the printed circuit board, and the first surface of the COF faces the array substrate, and the connection region is disposed at a side of the array substrate away from (i.e. opposite to) a light-emitting surface.

Since the first surface of the COF disposed with a chip of the present invention faces the array substrate (that is, the chip is disposed at an inner side of the COF), and one end of the first surface is connected with the connection region of the array substrate, and the other end of the first surface is connected with the printed circuit board, it does not need to be folded for connection, and the chip faces the array substrate, so that the width of the frame of the display apparatus may be reduced.

In an embodiment, the display panel may be an AMOLED display panel.

In an embodiment, the display panel may be an AMOLED display panel which emits light from its bottom.

In an embodiment, the printed circuit board may be disposed on a side of the array substrate away from the light-emitting surface.

In an embodiment, the COF may be attached to a surface of the printed circuit board away from the array substrate, and electronic components of the printed circuit board may be disposed on the surface of the printed circuit board.

In an embodiment, the wires on the surface of the printed circuit board facing the array substrate may be used to transfer signals between the electronic components of the printed circuit board.

An embodiment of the present invention further provides a display apparatus, comprising the above display panel.

According to the embodiments of the present invention, since the COF does not need to be folded, the frame of the display apparatus may be narrowed.

DETAILED DESCRIPTION

To make the technical solutions of the present invention to be better understood by those skilled in the art, the following will give a detailed description on the present invention in connection with the drawings and the detailed embodiments.

First Embodiment

Figure 1:
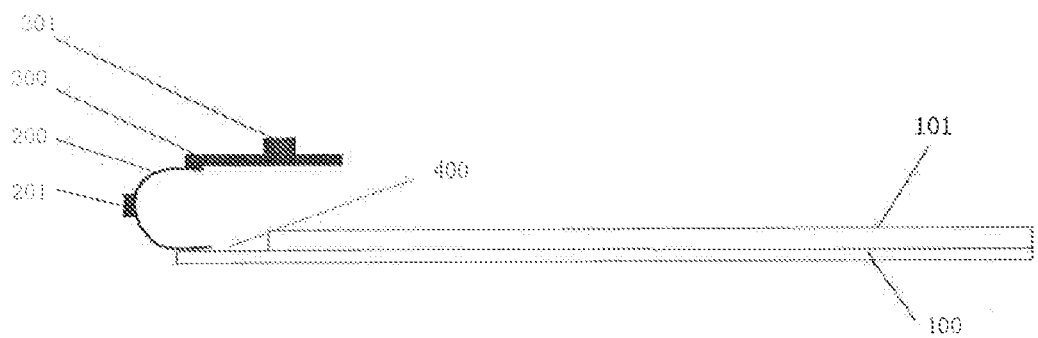
FIG. 1 is a schematic view illustrating an AMOLED display panel in the prior art.
Figure 2:
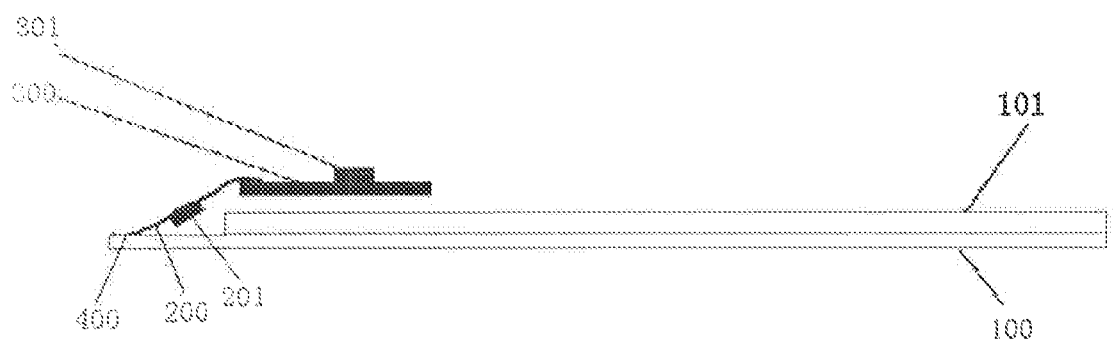
FIG. 2 is a schematic view illustrating an AMOLED display panel of a first embodiment of the present invention.

As illustrated in FIG. 2, the present embodiment provides a display panel, and the display panel comprises an array substrate 100, a printed circuit board 300, and a chip on film (COF) 200. A chip 201 is disposed on a first surface of the COF 200, and one end of the first surface is attached to a connection region 400 of the array substrate 100, and the other end of the first surface is attached to the printed circuit board 300. The first surface of the COF 200 faces the array substrate 100, and the connection region 400 is disposed at a side of the array substrate 100 away from a light-emitting surface.

The one end of the first surface of the COF 200 is attached to the connection region 400, that is, in a manner of inner attaching (i.e., the chip faces the array substrate), and the other end of the first surface is attached to and connected with the printed circuit board 300. In comparison with the prior art, the present embodiment may dispose the printed circuit board 300 on the back side of the array substrate 100 without having to fold the COF 200 by 180°, and since such a design does not have a folding region, the frame of the display panel may be narrowed, and at the same time, the folding radius is eliminated, so the display apparatus may be made thinner, and it is advantageous for thinning design. Since insulating glue or sealant covers the region where the array substrate 100 and an package layer 101 (the package layer 101 may be a sheet of separate substrate, and may also be a package cover) are bonded and the connection region 400, the chip 201 on the chip on film 200 would not contact the wire on the connection region 400.

Figure 3:
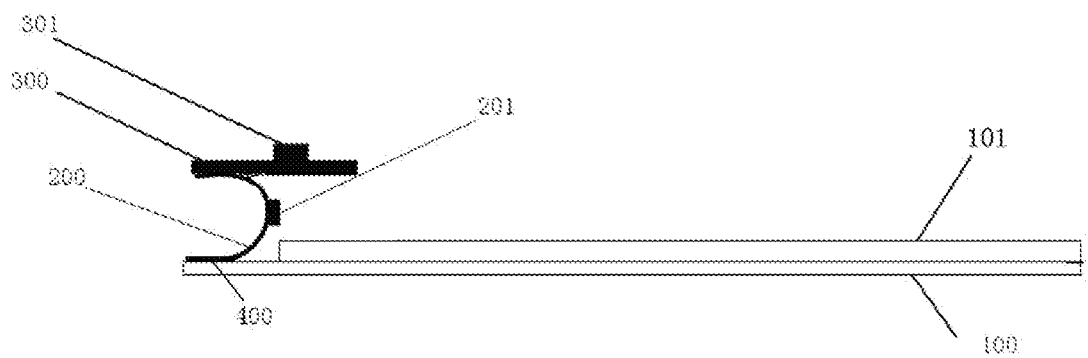
FIG. 3 is a schematic view illustrating a modification of the embodiment illustrated in FIG. 2.

Of course, if the manner illustrated in FIG. 3 is adopted, the COF may be folded, but it is inner-folded (that is, folded in a direction towards the array substrate), and it may also play a role to narrow the frame, but the thickness of the display apparatus is still too large.

Preferably, the display panel may be an active matrix organic light emitting diode (AMOLED) display panel. The non-light-emitting surface of the array substrate of the display panel is provided with a package layer 101, and the area of the array substrate is larger than that of the package layer 101, and the connection region 400 may be disposed at the segment difference between the array substrate 100 and the package layer 101.

Figure 4:
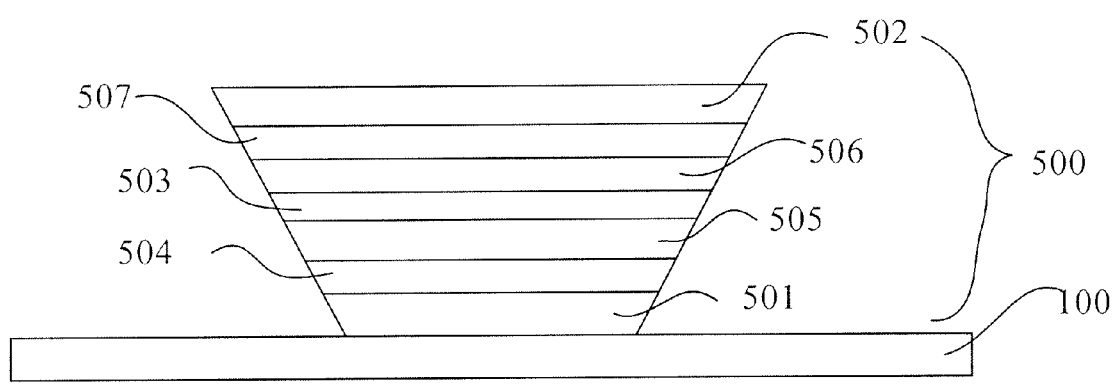
FIG. 4 is a schematic view illustrating an organic light emitting diode disposed on an array substrate.

As illustrated in FIG. 4, the above display panel may be an AMOLED display panel which emits light from the bottom. An organic light emitting diode 500 may be disposed on the array substrate 100, and the organic light emitting diode 500 generally comprises an anode 501, a cathode 502, and a "light-emitting layer" interposed between the anode 501 and the cathode 502. The "light-emitting layer" may be constituted by a plurality of different layers; the "light-emitting layer" comprises at least one organic electroluminescence material layer (EML) 503, and may further comprise: an electron transport layer (ETL) 506 and an electron injection layer (EIL) 507 between the EML 503 and the cathode 502, a hole injection layer (HIL) 504 and a hole transport layer (HTL) 505 between the EML 503 and the anode 501, and so on. Since in the AMOLED display panel which emits light from the bottom, the structures such as leads on the array substrate 100 are disposed on a surface of the array substrate 100 away from the light-emitting surface, and the direction of the connection region 400 exactly meets the requirement of the present embodiment. However, it should be understood that, with respect to other types of display panel, the structure of the present embodiment may also be applied, as long as the connection region 400 is disposed on a side of the array substrate 100 away from the light-emitting surface.

In an embodiment, the printed circuit board 300 may be disposed on a side of the array substrate 100 away from the displaying surface (that is, disposed on a surface of the array substrate which does not emit light). Thus, the printed circuit board 300 would not block the light, and would not occupy the area of the displaying region.

In an embodiment, the COF 200 may be attached to a surface of the printed circuit board 300 away from the array substrate, and the electronic components 301 of the printed circuit board 300 is also disposed on this surface. At this time, the wires on the surface of the printed circuit board 300 away from the array substrate 100 are transverse wires, and the wires on the surface of the printed circuit board 300 facing the array substrate 100 are used to transfer signals between the electronic components of the printed circuit board 300, that is, the wires are vertical wires, so that it would not exist a problem that the electronic components 301 of the printed circuit board 300 compete the space with the vertical wires, and the layout wiring of the circuit board would be more easier, and the printed circuit board 300 may be made narrower, so as to reduce the cost.

Meanwhile, since the COF 200 is attached to the surface of the printed circuit board 300 disposed with the electronic components 301, it makes the electronic components 301 to be more close to the chip on film 200, so that the components such as capacitor have a better function of filtering, and the performance of the printed circuit board 300 is improved.

Second Embodiment

The present embodiment provides a display apparatus, which comprises the above display panel. The display apparatus may be any product or component having displaying function, such as an OLED panel, a mobile phone, a tablet PC, a television, a display, a notebook computer, a digital photo frame, a navigator and so on.

The display apparatus of the present embodiment has the display panel in the first embodiment, so that the display apparatus has a narrower frame and a thinner thickness.

Of course, the display apparatus of the present embodiment may further comprise other conventional structures, such as a power source unit and so on.

It may be understood that the above embodiments are merely exemplary embodiments used to explain the principles of the present invention. Those with ordinary skills in the art may make various modifications and changes without departing the spirit and essential of the present invention, and these modifications and changes should be regarded within the protection scope of the present invention.

What is claimed is:
1. A display panel, comprising:
an array substrate,
a printed circuit board,
a chip-on-film comprising a chip and a film, wherein:
the chip is disposed on a first surface of the film of the chip-on-film, and one end of the first surface is attached to a connection region of the array substrate, and the other end of the first surface is attached to the printed circuit board, and the first surface of the film of the chip-on-film faces the array substrate, and the connection region is disposed at a side of the array substrate away from a light-emitting surface, wherein the chip of the chip-on-film is disposed on a side of the chip-on-film closest to the array substrate, and the chip-on-film extends from the one end in an inward direction, wherein the entirety of the chip-on-film is disposed within an area defined by the outermost edges of the array substrate such that the entirety of the chip-on-film overlaps a non-light emitting surface of the array substrate that opposes the light-emitting surface, and wherein the printed circuit board is disposed on a side of the array substrate away from the light-emitting surface, wherein wires on a surface of the printed circuit board are used to transfer signals between electronic components of the printed circuit board, and the surface of the printed circuit board on which the wires are formed faces the array substrate, and wherein the chip-on-film is directly attached to an upper surface of the printed circuit board that faces away from the array substrate, and the electronic components of the printed circuit board are disposed on the upper surface of the printed circuit board that faces away from the array substrate, wherein the first surface of the film of the chip-on-film is attached to the upper surface of the printed circuit board that faces away from the array substrate.

2. The display panel according to claim 1, wherein the display panel is an active matrix organic light emitting diode (AMOLED) display panel.

3. The display panel according to claim 2, wherein the display panel is an AMOLED display panel which emits light from its bottom.

4. A display apparatus, comprising the display panel according to claim 1.

5. The display panel according to claim 1, wherein the entirety of the first surface faces the array substrate.

* * * * *